(12) United States Patent
Wu et al.

(10) Patent No.: US 11,133,238 B2
(45) Date of Patent: Sep. 28, 2021

(54) HEAT SINK FASTENING SEAT AND SECURING DEVICE WITH GASKET FOR USE WITH ELECTRICAL CONNECTOR

(71) Applicants: FU DING PRECISION COMPONENT (SHEN ZHEN) CO., LTD., Shenzhen (CN); FOXCONN INTERCONNECT TECHNOLOGY LIMITED, Grand Cayman (KY)

(72) Inventors: Heng-Kang Wu, Shenzhen (CN); Fu-Jin Peng, Shenzhen (CN)

(73) Assignees: FUDING PRECISION COMPONENTS (SHENZHEN) CO., LTD., Shenzhen (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/161,108

(22) Filed: Oct. 16, 2018

(65) Prior Publication Data
US 2019/0115282 A1 Apr. 18, 2019

(30) Foreign Application Priority Data
Oct. 16, 2017 (CN) .......................... 201721331828.0

(51) Int. Cl.
*H01L 23/40* (2006.01)

(52) U.S. Cl.
CPC .... *H01L 23/4006* (2013.01); *H01L 2023/405* (2013.01); *H01L 2023/4031* (2013.01); *H01L 2023/4062* (2013.01); *H01L 2023/4087* (2013.01)

(58) Field of Classification Search
CPC ..... H01L 2023/4062; H01L 2023/4087; H01L 2023/405
See application file for complete search history.

(56) References Cited

U.S. PATENT DOCUMENTS

| | | | | |
|---|---|---|---|---|
| 2005/0136750 A1* | 6/2005 | Tournier | ................ | H01R 4/302 439/801 |
| 2006/0007652 A1* | 1/2006 | Yatskov | .............. | H01L 23/4093 361/679.47 |
| 2009/0073663 A1* | 3/2009 | Degenkolb | ........ | H05K 7/20854 361/724 |

FOREIGN PATENT DOCUMENTS

| CN | 2523023 Y | 11/2002 |
|---|---|---|
| CN | 205212058 U | 5/2016 |
| CN | 106711685 A | 5/2017 |

* cited by examiner

*Primary Examiner* — Amar Movva
(74) *Attorney, Agent, or Firm* — Ming Chieh Chang; Wei Te Chung

(57) ABSTRACT

An electrical connector assembly for connecting the CPU and the printed circuit board, includes an electrical connector and a back plate respectively mounted upon two opposite surfaces of the printed circuit board. A fastening seat partially surrounds the connector for securing a heat sink which is downwardly seated upon the CPU for heat dissipation. The back plate forms a plurality of securing studs extending through the fastening seat. The heat sink further includes a plurality of tubular securing nuts respectively surrounded by the corresponding coil springs and secured to the corresponding securing studs in an adjustable manner so as to impose the downward force upon the heat sink to urge the heat sink to abut downwardly against the CPU for heat dissipation of the CPU.

16 Claims, 9 Drawing Sheets

HEAT SINK FASTENING SEAT AND SECURING DEVICE WITH GASKET FOR USE WITH ELECTRICAL CONNECTOR

BACKGROUND OF THE DISCLOSURE

1. Field of the Disclosure

The present disclosure relates to the heat sink fastening seat, and particularly to the fastening seat for use with the electrical connector receiving therein a CPU (Central Processing Unit) or an electronic package on which the heat sink is mounted.

2. Description of Related Arts

China Invention Patent No. CN106711685 discloses an electrical connector surrounded by a U-shaped heat sink fastening seat, and a pair of metallic spring blades mounted upon two opposite arms of the fastening seat. A metallic back plate cooperates with the fastening seat to sandwich between a printed circuit board on which the connector is mounted. Understandably, the spring blade provides the required resilient force to urge the heat sink against the CPU while the spring blades may require the high quality material thereof and relatively many components therewith for securement, thus costing relatively much money.

An improved resilient device for urging the heat sink against the CPU is desired.

SUMMARY OF THE DISCLOSURE

Accordingly, an object of the present disclosure is to provide an electrical connector assembly for connecting the CPU and the printed circuit board, including an electrical connector and a back plate respectively mounted upon two opposite surfaces of the printed circuit board. The electrical connector includes an insulative housing with the contacts retained therein for mating with the CPU, and a fastening seat partially surrounding the housing for securing a heat sink which is downwardly seated upon the CPU for heat dissipation. The fastening seat forms a plurality of first holes and the heat sink forms a plurality of second holes in vertical alignment with the corresponding first holes, respectively. The back plate forms a plurality of securing studs extending through the corresponding first holes. The heat sink further includes a plurality of tubular securing nuts respectively surrounded by the corresponding coil springs and secured to the corresponding securing studs in an adjustable manner so as to impose the downward force upon the heat sink to urge the heat sink against the CPU for heat dissipation of the CPU.

The connector is essentially of a rectangular configuration with two opposite long sides and two opposite short sides wherein the securement between the heat sink and the back plate is located on the long side while the securement between the fastening seat and the back plate is located on the short side.

Other objects, advantages and novel features of the disclosure will become more apparent from the following detailed description when taken in conjunction with the accompanying drawings.

DETAILED DESCRIPTION OF THE PREFERRED EMBODIMENT

Figure 1:
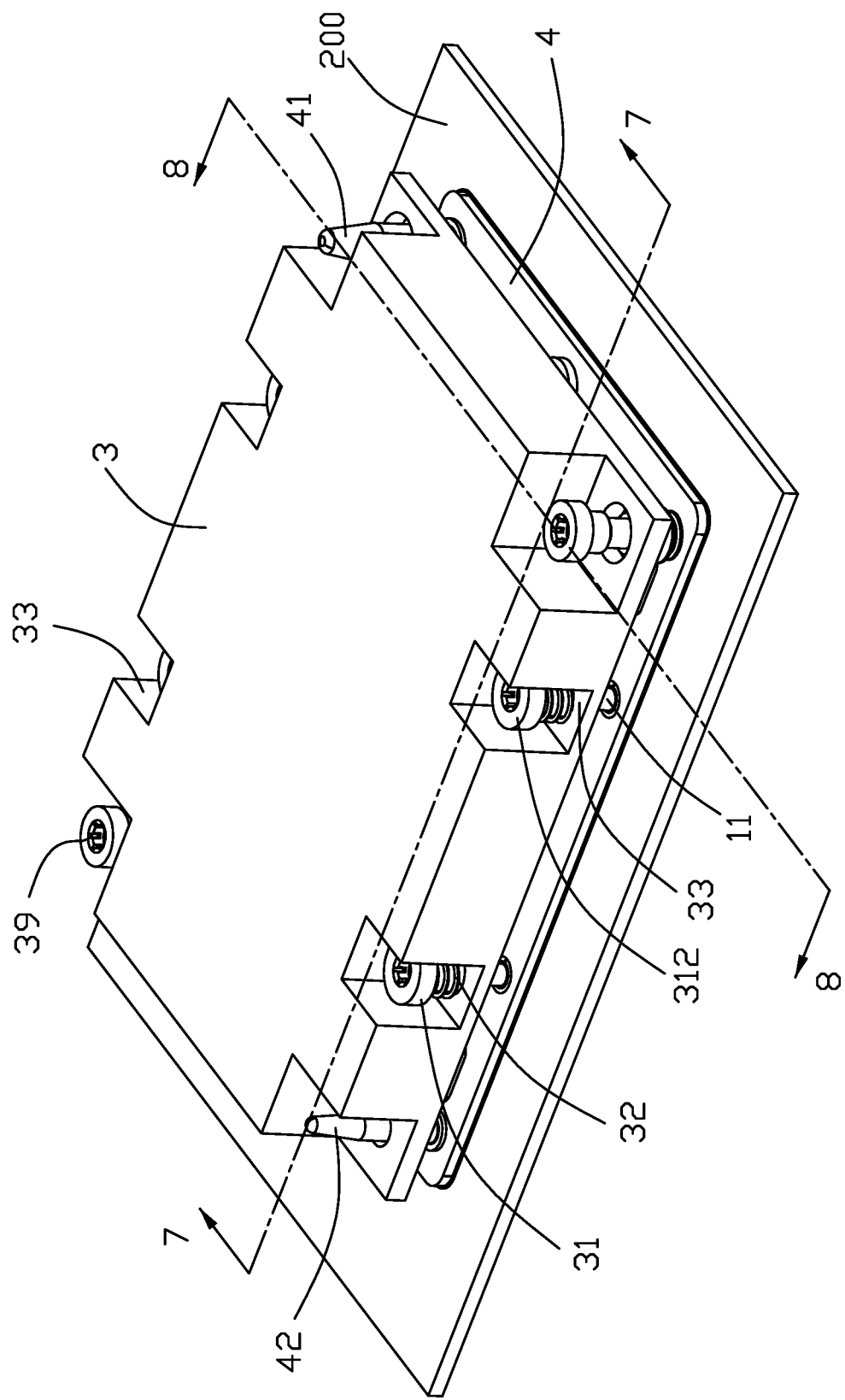
FIG. 1 is a perspective view of the electrical connector assembly mounted upon the printed circuit board according to a first embodiment of the invention.
Figure 2:
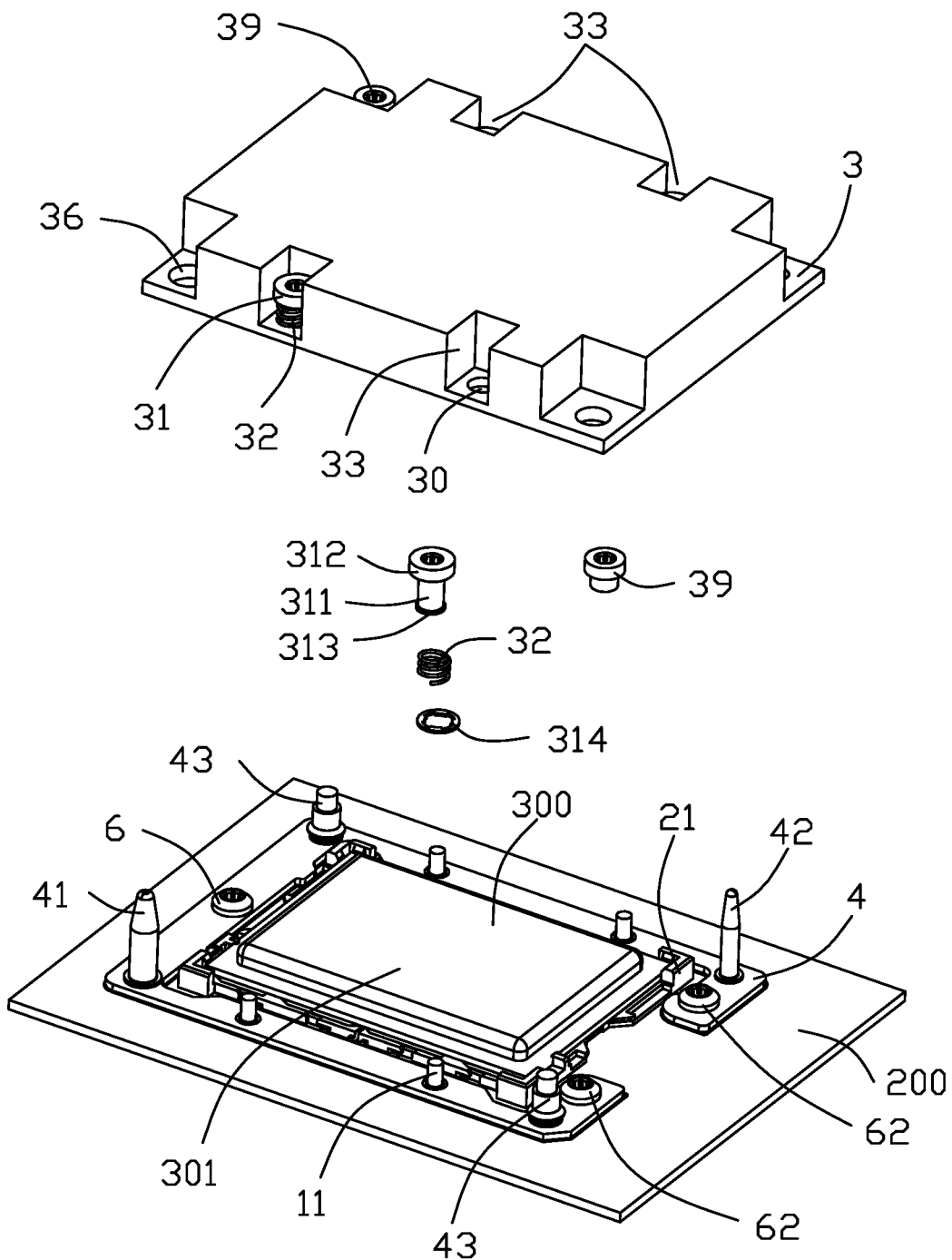
FIG. 2 is an exploded perspective view of the electrical connector assembly mounted upon the printed circuit board of FIG. 1 wherein the heat sink is moved away from the connector.
Figure 3:
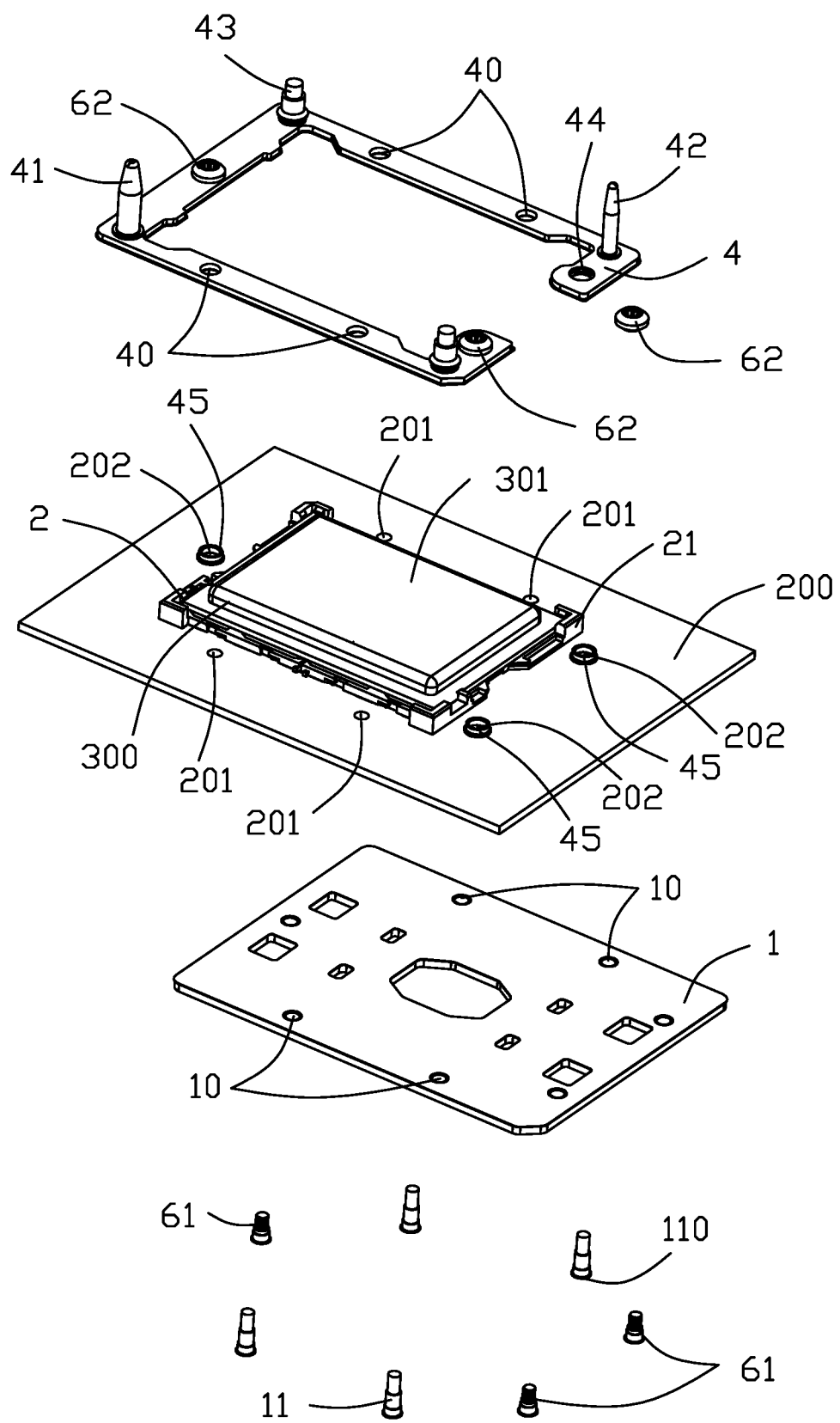
FIG. 3 is a further exploded perspective view of the electrical connector assembly mounted upon the printed circuit board of FIG. 1 without showing the heat sink.
Figure 4:
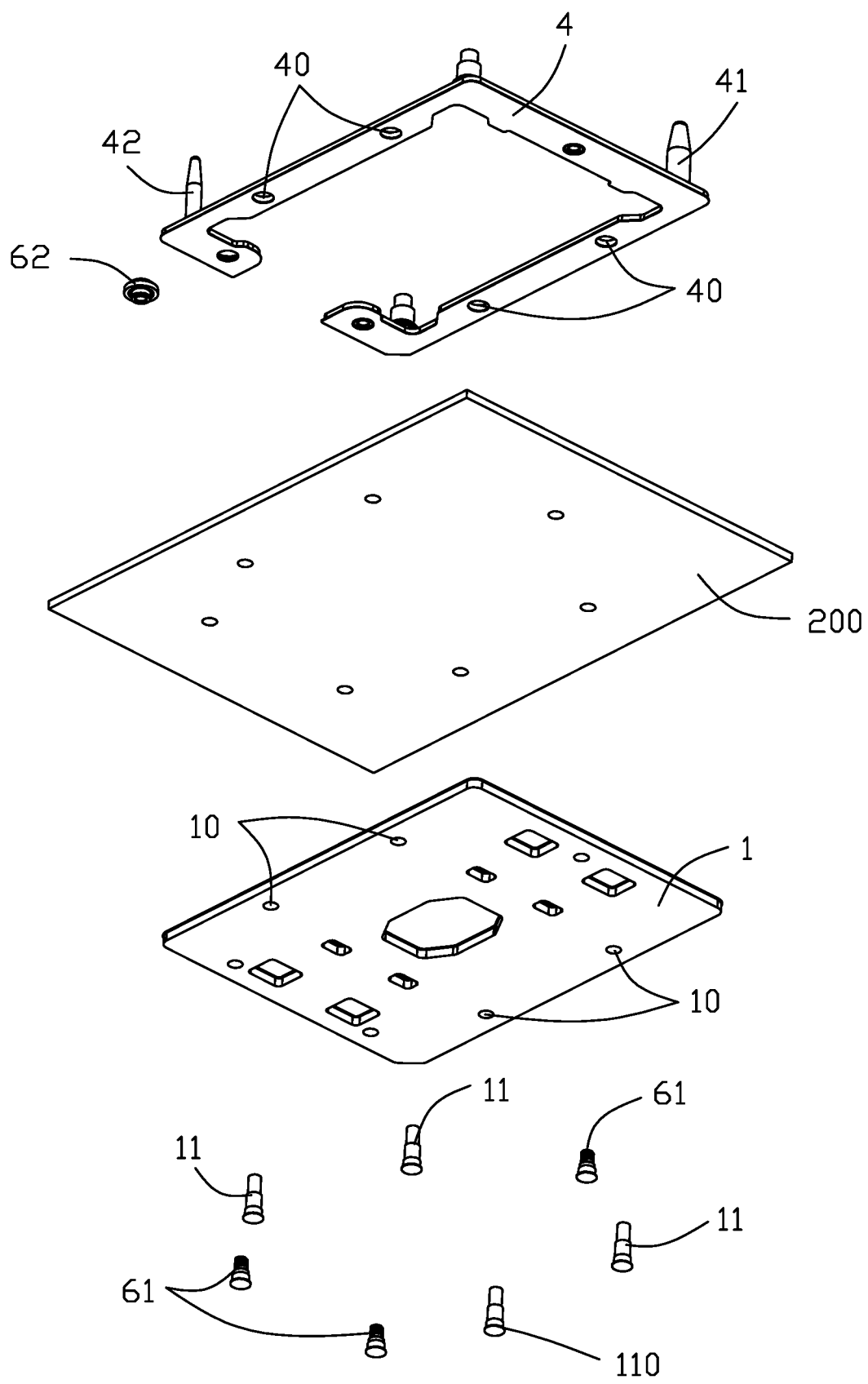
FIG. 4 is another exploded perspective view of the electrical connector assembly mounted upon the printed circuit board of FIG. 3.
Figure 5:
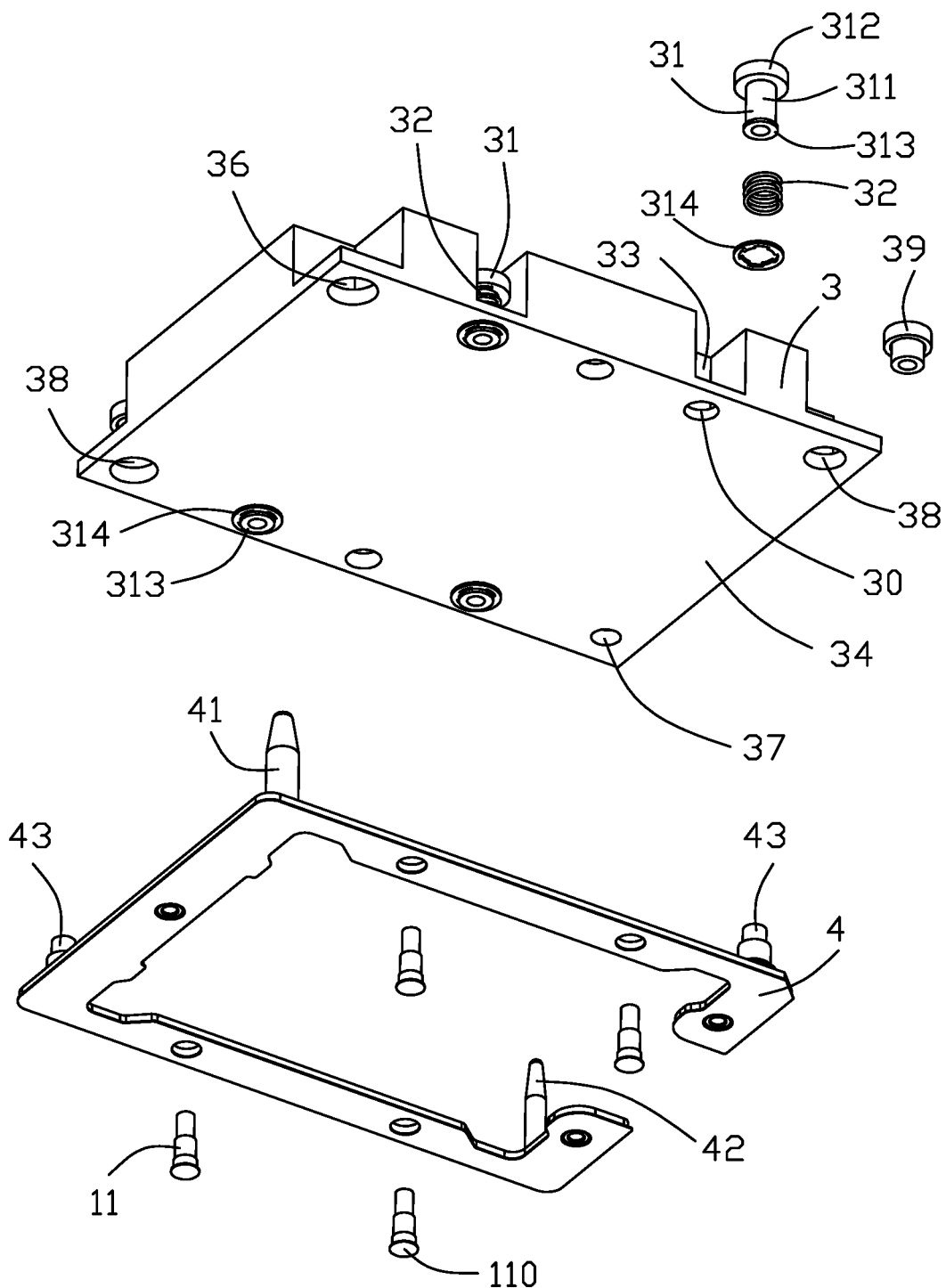
FIG. 5 is an exploded perspective view of portions of the electrical connector assembly of FIG. 1 without showing the connector and the printed circuit board.
Figure 6:
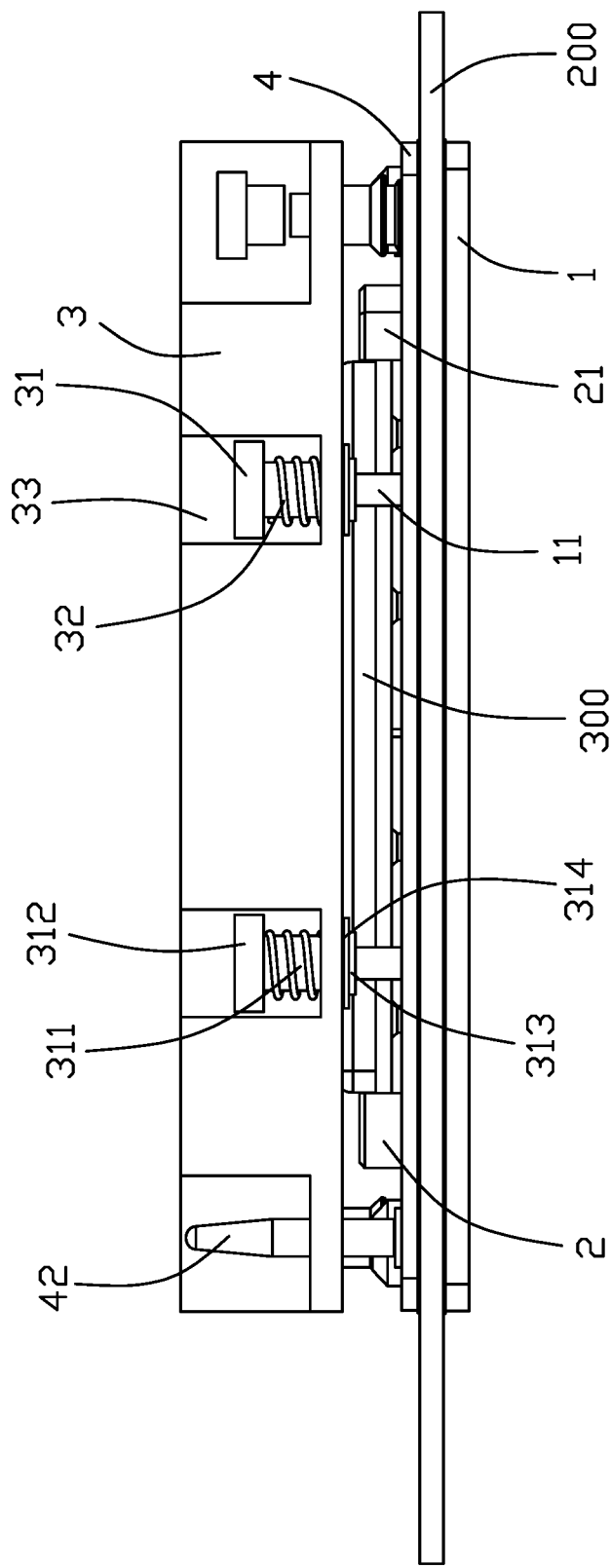
FIG. 6 is a side view of the electrical connector assembly of FIG. 1.
Figure 7:
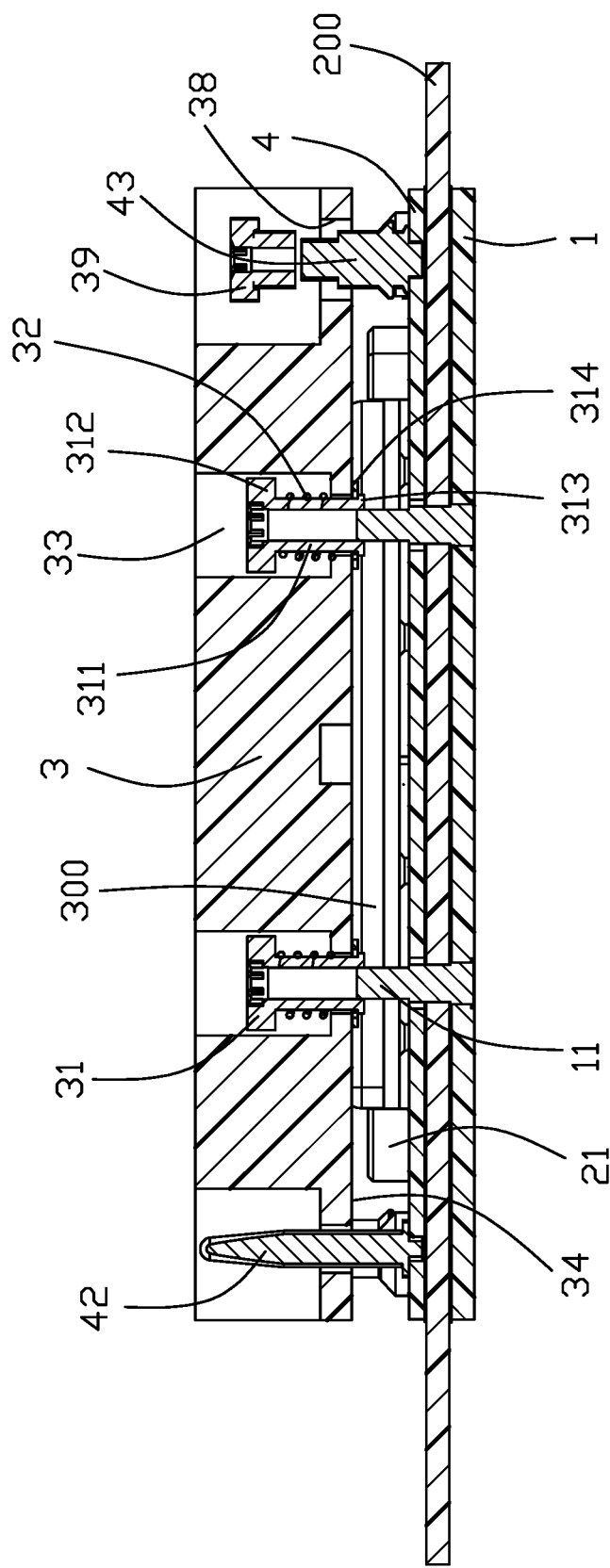
FIG. 7 is a cross-sectional view of the electrical connector assembly of FIG. 1.

Reference description will now be made in detail to the embodiment of the present disclosure.

Referring to FIGS. 1-8, an electrical connector assembly is mounted upon the printed circuit board 200 for connecting the CPU 300, which is received in the connector, to the printed circuit board 200. The electrical connector assembly includes an electrical connector 2 and a stiff/metallic back plate 1 disposed upon two opposite surfaces of the printed circuit board 200, and a heat sink 3. The electrical connector 2 includes an insulative housing 21 and a plurality of contacts (not shown) which may be like those disclosed in U.S. Pat. No. 6,697,263 and retained in the housing 21, and a metallic fastening seat 4 beside the housing 21. The fastening seat 4 includes a plurality of first through holes 40, and the heat sink includes a plurality of second through holes 30 in vertical alignment with the corresponding first through holes 40. The back plate 1 includes a plurality of securing studs/screws 11 (the threads not shown), and the heat sink 3 includes a plurality of securing nuts 31 surrounded by corresponding coil springs 32, extending through the corresponding second through holes 30 and threaded with the corresponding securing screws 11, respectively, so as to fasten the heat sink 3 to the back plate 1.

In this embodiment, the heat sink 3 forms a plurality of receiving cavities 33 to receive the corresponding securing nuts 31 and the corresponding coil spring 32 thereon. The nut 31 includes a main body 311 and a head 312 diametrically larger than the main body 311. The coil spring 32 surrounds the main body 311, and the bottom end of the main body 311 is secured to the securing screw 11 to commonly form a securing device. Notably, the coil spring 32 is diametrically larger than the corresponding second through hole 30 while smaller than the head 312, thus being sandwiched between the head 312 and the abutment surface (not labeled) under the corresponding receiving cavity 33. The nut 31 further includes a ring 313 at the bottom end and a moveable gasket 314 above the ring 313. Notably, the ring 313 is diametrically not larger than the second through hole 30 while the gasket 314 is larger than the second through hole 30 so as to restrict upward movement of the nut 31 once the nut 31 is assembled to the heat sink 3 but has not been secured to the corresponding securing screw 11.

Notably, the undersurface 34 of the heat sink 3 intimately abuts against the top surface 301 of the CPU 300. Because the coil springs 32 are in a compressed manner to impose the downward forces upon the heat sink 3, the CPU is urged by the heat sink 3 to firmly press downwardly against the CPU 300 to assure mechanical and electrical connection between the CPU 300 and the corresponding contacts (not shown). Understandably, because such a downward imposed forces by the heat sink 3 are made via the coil springs 32 in a buffered manner, the connection between the CPU 300 and the electrical connector 2 is moderate and reliable.

In this embodiment, the bottom end of the screw 11 has a riveted head 110 for securing into the rivet hole 10 of the back plate 1. The printed circuit board 200 forms the corresponding third through holes 201 in vertical alignment with the corresponding first through holes 40 and second through holes 30 so as to allow the securing screw 11 to extend therethrough. The third through hole 201 is diametrically same with the corresponding portion of the securing screw 11 so as to securing the back plate 1 and the printed circuit board 200 together without relative movement therebetween. Differently, the first through hole 40 is diametrically larger than the corresponding portion of the securing screw 11.

The fastening seat 4 has a first positioning post 41 and a second positioning post 42 at two diagonal corners. Correspondingly, the heat sink 3 has a first positioning hole 36 and a second positioning hole 37 to respectively receive compliantly the first positioning post 41 and the second positioning post 42. Because first positioning post 41 is diametrically larger than the second positioning post 42, thus allowing only one orientation of the heat sink 3 during assembling thereto. A pair of screws 43 are located at another pair of diagonal corners and extend through the corresponding holes 38 to secure to the corresponding nuts 39.

Figure 8:
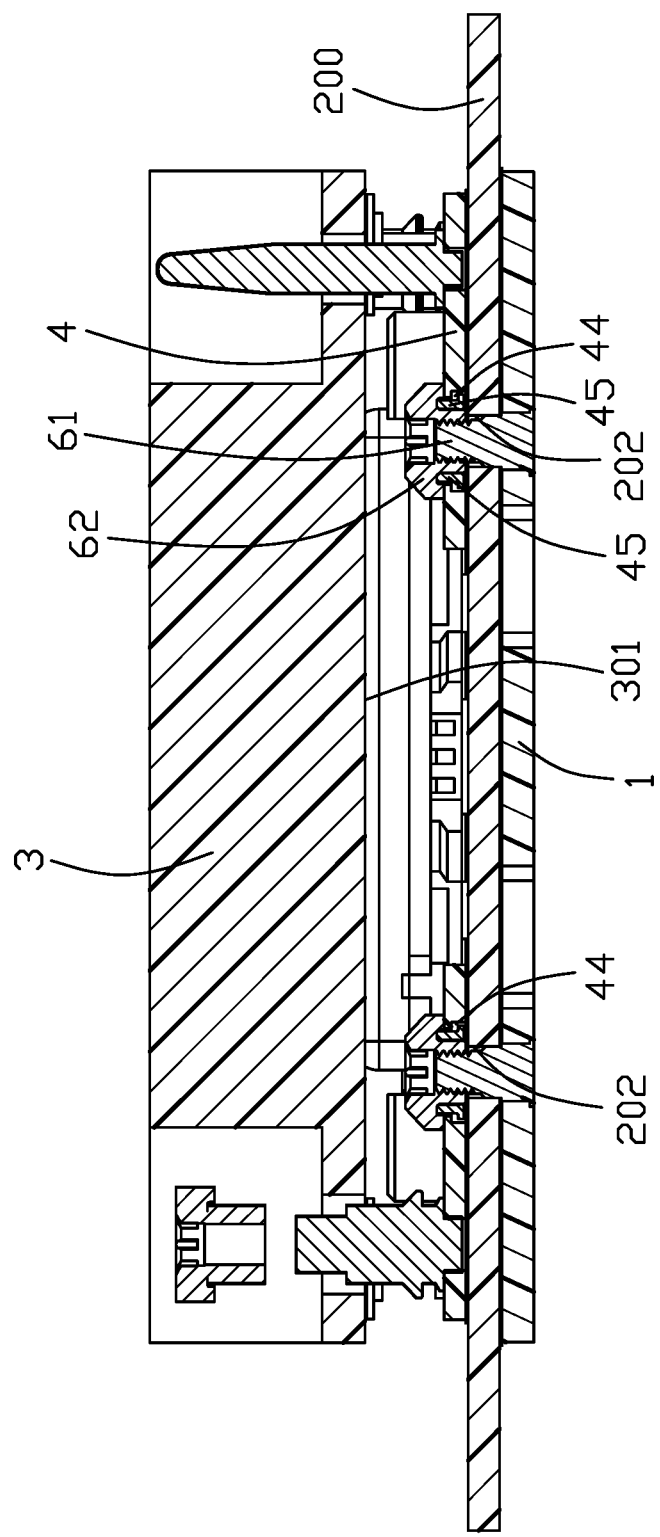
FIG. 8 is another cross-sectional view of the electrical connector assembly of FIG. 1.

As shown in FIG. 8, the fastening seat 4 is fastened to the back plate 1 by the fastening device 6 which includes a plurality of fastening screws 61 riveted on the back plate 1, and a plurality of fastening nuts 62 in the holes 44 of the fastening seat 4 and fixed to the corresponding screws 61 to press the fastening seat 4 toward the back plate 1. In this embodiment, each hole 44 is equipped with a rim 45 which is attached on the top surface of the printed circuit board 200 to be received within the corresponding hole 44 and to surround the corresponding nut 62. Similarly to the hole 201, the holes 202 of the printed circuit board 200 snugly receive the corresponding fastening screws 61 so as to assure securement between the printed circuit board 200 and the back plate 1 not only in the vertical direction but also in all horizontal directions.

In assembling, the connector 2 is soldered upon the printed circuit board 200, and the back plate 1 and the fastening seat 4 are respectively disposed upon two opposite top and bottom surfaces of the printed circuit board 200 and further fastened together with the printed circuit board 200 therebetween in the vertical direction by have the fastening nuts 62 fixed to the corresponding screws 61. Successively, the heat sink 3 is fastened above the connector 2 by having the securing nuts 31 fixed to the corresponding securing screws 11 so as to have the CPU 300 under the heat sink 3 properly received within the housing 21 of the electrical connector 2 for electrical connection. Notably, in this embodiment, the securement between the back plate 1 and the fastening seat 4 occurs on two short sides via fixation between the fastening screws 61 and the fastening nuts 62, and the securement between the back plate 1 and the heat sink 3 occurs on two long sides via fixation between the screws 11 and the securing nuts 31 while the securement between the back plate 1 and the printed circuit board 200 occurs on both the two opposite long sides and the two opposite short sides via both aforementioned two fixations. Compared with the structure disclosed in the aforementioned China reference which uses different mechanisms for respective retention between the back plate and the heat sink, and between the back plate and the printed circuit board on the same long side, the instant invention uses the same axial structures to secure the heat sink 3, the printed circuit board 200 and the back plate 1 together with less space and less cost.

Figure 9:
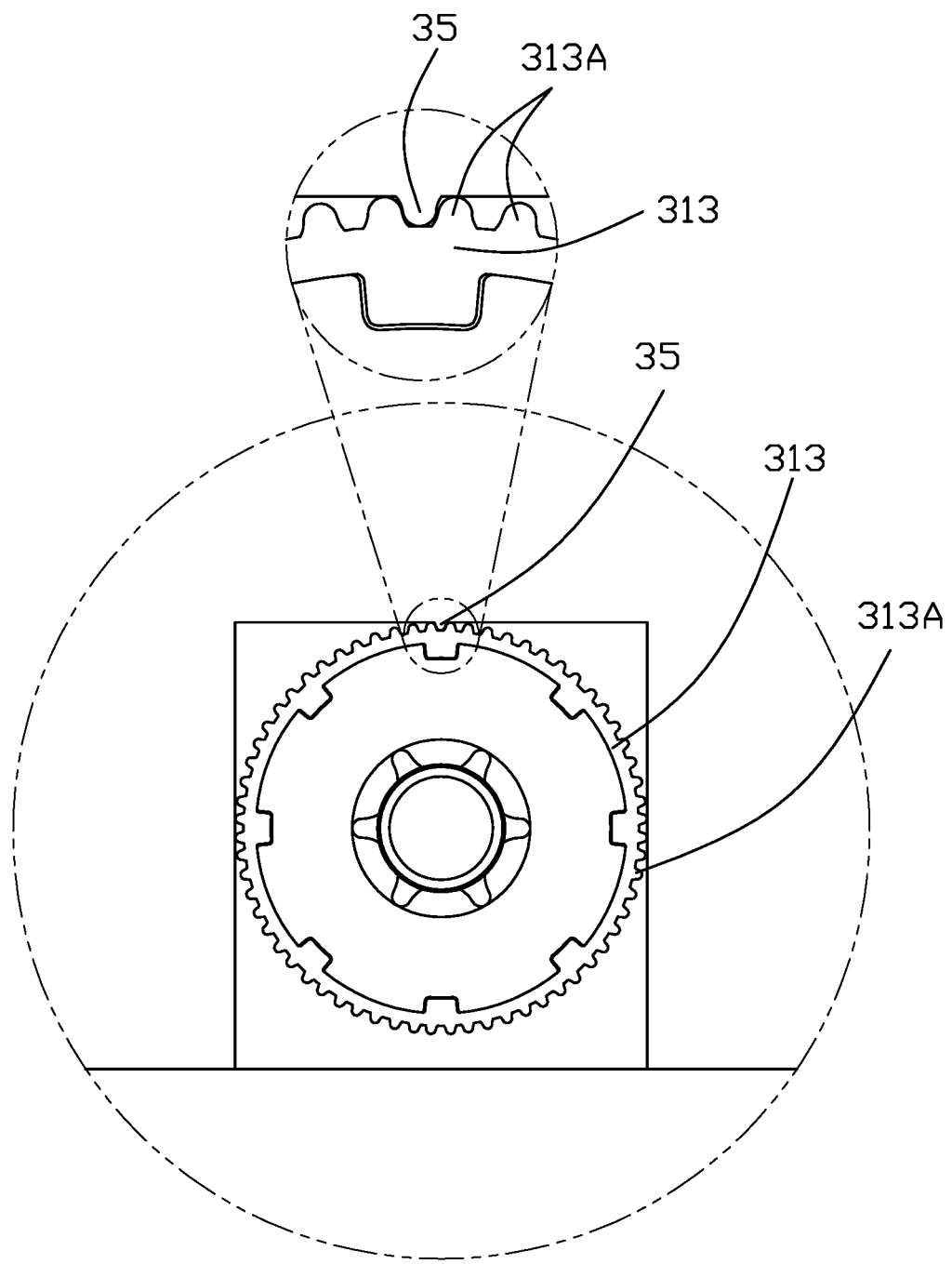
FIG. 9 is an enlarged top view of a portion of the electrical connector assembly of FIG. 1.

FIG. 9 shows another embodiment of the invention wherein the heat sink 3 forms an engagement rib 35 in the receiving cavity 33, and the securing nut 31 is equipped with a rubber ring 313 associated with the head 312. The rubber ring 313 has teeth 313A thereon to selectively engage the engagement rib 35 so as to avoid unwanted loosening between the securing nut 31 and the securing screw 11 due to tension of the coil springs 32. In brief, the engagement between the engagement rib 35 and the teeth 313A prevents unintentional rotation of the securing nut 31 during vibration.

What is claimed is:

1. An electrical connector assembly comprising:
a printed circuit board defining opposite top surface and undersurface thereon in a vertical direction;
an electrical connector and a metallic fastening seat beside the connector commonly mounted upon the top surface;
a stiff metallic back plate positioned on the undersurface;
an electronic package received in the electrical connector;
a heat sink positioned upon the electronic package; and
a securing device securing the heat sink and the back plate together in the vertical direction with a spring thereon to downwardly press the heat sink against the electronic package in the vertical direction; wherein
said securing device includes an upward securing screw riveted on the back plate, and a securing nut discrete from the securing screw while being fixed to a top end of the securing screw, and a top end of the spring upwardly abuts against a head of the securing nut; wherein
a gasket is disposed at a bottom end of the securing nut and, when the securing nut is disengaged from the securing screw, upward abuts against an undersurface of the heat sink so as to prevent upward withdrawal of the securing nut from the heat sink.

2. The electrical connector assembly as claimed in claim 1, wherein the securing screw is snugly received within a corresponding hole of the printed circuit board.

3. The electrical connector assembly as claimed in claim 1, wherein the securing screw is loosely received within a corresponding hole of the fastening seat.

4. The electrical connector assembly as claimed in claim 1, further including a fastening device to fix the fastening seat and the back plate together in the vertical direction.

5. The electrical connector assembly as claimed in claim 4, wherein said fastening device includes a fastening screw having a bottom end riveted on the back plate and a fastening nut fixed to a top end of the fastening screw and downwardly pressing the fastening seat toward the back plate.

6. The electrical connector assembly as claimed in claim 4, wherein the electrical connector assembly defines a rectangular configuration with two opposite long sides and two opposite short sides, and the securing device is located on the long side while the fastening device is located on the short side.

7. The electrical connector assembly as claimed in claim 4, wherein the printed circuit board forms a plurality of holes to snugly receive the securing device and the fastening device therein so as to avoid relative movement of the printed circuit board with regard to the back plate in both the vertical direction and any horizontal directions perpendicular to said vertical direction.

8. The electrical connector assembly as claimed in claim 1, wherein the heat sink forms a receiving cavity to receive the securing nut and the spring therein.

9. The electrical connector assembly as claimed in claim 8, wherein said spring is a coil spring surrounding the securing nut.

10. An electrical connector assembly comprising:
a printed circuit board defining opposite top surface and undersurface thereon in a vertical direction;
an electrical connector and a metallic fastening seat beside the connector commonly mounted upon the top surface;
a stiff metallic back plate positioned on the undersurface;
an electronic package received in the electrical connector
a heat sink positioned upon the electronic package;
a securing device essentially coaxially securing the back plate and the heat sink together in the vertical direction; and
means for preventing unintentional self-rotation of the securing device during vibration; wherein
the securing device is further equipped with a compressive spring to constantly urge the heat sink to abut against the electronic package downwardly; wherein
the securing device includes a securing screw riveted to the back plate and a securing nut discrete from the securing screw while being attached to a top end of the securing screw, and the spring has two ends respectively imposing forces upon a head of the securing nut and the heat sink; wherein
said spring is a coil spring to surround the securing nut, and said securing nut is further equipped with a gasket at a bottom end so as to avoid withdrawal from the heat sink.

11. The electrical connector as claimed in claim 10, wherein said means is formed on the head of the securing nut and on the heat sink.

12. The electrical connector as claimed in claim 10, wherein the printed circuit board forms a plurality of through holes to respectively snugly receive the corresponding securing device so as to avoid movement of the printed circuit board relative to the back plate in a horizontal plane.

13. An electrical connector assembly comprising:
a printed circuit board with two opposite top surface and bottom surface in a vertical direction;
an electrical connector on the top surface of the printed circuit board;
an electronic package disposed upon the electrical connector;
a heat sink disposed upon the electronic package;
a metallic fastening seat disposed upon the top surface of the printed circuit board beside the electrical connector;
a stiff metallic back plate disposed upon the bottom surface of the printed circuit board; and
a securing device fixing the back plate and the heat sink together in the vertical direction; wherein
said securing device is equipped with a compressive spring to constantly urging the heat sink to abut against the electronic package; wherein
the securing device includes a securing screw nut surrounded by the compressive spring, and a gasket is disposed at a bottom end of the securing screw nut and, when the securing screw nut is detached from the back plate, upwardly abuts against an underside of the heat sink so as to prevent upward withdrawal of the securing screw nut from the heat sink.

14. The electrical connector assembly as claimed in claim 13, further including a fastening device fixing the back plate and the fastening seat together in the vertical direction, wherein both the securing device and the fastening device are riveted to the back plate.

15. The electrical connector assembly as claimed in claim 14, wherein the fastening seat forms a through hole loosely receiving the securing device while another through hole snugly receiving the fastening device.

16. The electrical connector assembly as claimed in claim 14, wherein the printed circuit board forms a plurality of through holes respectively snugly receiving the securing device and the fastening device.

* * * * *